United States Patent
Kozak et al.

(10) Patent No.: US 7,439,891 B2
(45) Date of Patent: Oct. 21, 2008

(54) METHODS AND APPARATUS FOR SIGMA-DELTA MODULATOR HAVING SELECTABLE OSR WITH OPTIMAL RESONATOR COEFFICIENT

(75) Inventors: Mucahit Kozak, Victor, NY (US); Eugene Michael Petilli, Victor, NY (US)

(73) Assignee: Intrinsix Corporation, Marlborough, MA (US)

( * ) Notice: Subject to any disclaimer, the term of this patent is extended or adjusted under 35 U.S.C. 154(b) by 0 days.

(21) Appl. No.: 11/745,094

(22) Filed: May 7, 2007

(65) Prior Publication Data
US 2007/0236376 A1    Oct. 11, 2007

Related U.S. Application Data

(63) Continuation of application No. 11/279,172, filed on Apr. 10, 2006, now Pat. No. 7,215,270.

(51) Int. Cl.
*H03M 3/00* (2006.01)
(52) U.S. Cl. ..................... 341/143
(58) Field of Classification Search ........ 341/143
See application file for complete search history.

(56) References Cited

U.S. PATENT DOCUMENTS

| | | | |
|---|---|---|---|
| 5,055,843 A | 10/1991 | Ferguson, Jr. et al. | |
| 5,181,032 A | 1/1993 | Ribner | |
| 5,311,181 A | 5/1994 | Ferguson, Jr. et al. | |
| 5,392,042 A | 2/1995 | Pellon | |
| 5,557,642 A * | 9/1996 | Williams | 375/316 |
| 5,729,230 A | 3/1998 | Jensen et al. | |
| 6,148,048 A | 11/2000 | Kerth et al. | |
| 6,271,781 B1 | 8/2001 | Pellon | |
| 6,330,031 B1 | 12/2001 | Petilli | |
| 6,369,745 B1 | 4/2002 | Lee et al. | |
| 6,396,428 B1 | 5/2002 | Cheng | |
| 6,400,297 B1 | 6/2002 | Tucker | |
| 6,414,615 B1 | 7/2002 | Cheng | |
| 6,429,797 B1 * | 8/2002 | Wu | 341/143 |
| 6,489,907 B2 | 12/2002 | Cusinato et al. | |
| 6,538,588 B1 * | 3/2003 | Bazarjani | 341/143 |
| 6,577,258 B2 | 6/2003 | Rusha et al. | |
| 6,744,392 B2 | 6/2004 | Melanson | |
| 6,894,632 B1 | 5/2005 | Robinson | |
| 7,215,270 B1 | 5/2007 | Kozak et al. | |
| 2003/0067494 A1 | 4/2003 | Ruha et al. | |
| 2003/0081803 A1 | 5/2003 | Petelli et al. | |
| 2006/0038709 A1 | 2/2006 | Lu et al. | |

FOREIGN PATENT DOCUMENTS

JP    02005191810 A    7/2005

OTHER PUBLICATIONS

Analog Devices, AD7705/AD7706/AD7707, Instrumentation Converter FAQs: Architecture, Oct. 2003, pp. 1-3.

(Continued)

*Primary Examiner*—Howard Williams
(74) *Attorney, Agent, or Firm*—Daly, Crowley, Mofford & Durkee, LLP (57) ABSTRACT

A programmable Sigma-Delta Modulator (SDM) includes a first input to select an oversampling rate (OSR), which has a corresponding resonator coefficient value to provide an optimal notch in the Noise Transfer Function (NTF).

1 Claim, 4 Drawing Sheets

OTHER PUBLICATIONS

Dallas Semiconductor Maxim, Demystifying Sigma-Delta ADCs, Jan. 31, 2003, pp. 1-15, Application Note 1870.

Maxim Integrated Products, +5V, 18-Bit, Low-Power, Multichannel, Oversampling (Sigma-Delta) ADC, Jul. 2002, pp. 1-38.

Luca Daniel, Marco Sabatini, BandPass Sigma-Delta Modulator for Wideband IF Signals, May 20, 1999, pp. 1-6.

Xavier Haurie and Gordon W. Robert, A Design, Simulation and Synthesis Tool For Delta-Sigma-Modulator-Based Signal Sources, May 1996, pp. 1-4, IEEE Symposium on Circuits and Systems, Atlanta, Georgia.

Sangil Park, Ph.D., Motorola Digital Signal Processors, Principles of Sigma-Delta Modulation For Analog-to-Digital Converters, printed out from www.motorola.com on Dec. 19, 2005, pp. 1-64.

Richard Schreier, Gabor C. Temes, Higher-Order Delta-Sigma Modulation, 2005, pp. 91-138, Institute of Electrical and Electronics Engineers, Inc.

* cited by examiner

METHODS AND APPARATUS FOR SIGMA-DELTA MODULATOR HAVING SELECTABLE OSR WITH OPTIMAL RESONATOR COEFFICIENT

CROSS REFERENCE TO RELATED APPLICATIONS

This application is a continuation of U.S. patent application Ser. No. 11/279,172 filed on Apr. 10, 2006, now U.S. Pat. No. 7,215,270 which is incorporated herein by reference.

STATEMENT REGARDING FEDERALLY SPONSORED RESEARCH

Not Applicable.

BACKGROUND

Various types of Analog-to-Digital Converter (ADC) circuits are well known in the art. One type of ADC is the sigma-delta or delta-sigma ADC. In general, a sigma-delta ADC includes a sigma delta modulator (SDM) and a digital filter. The sigma delta ADC oversamples an analog input signal and generates a bit stream output having an average value that tracks the analog input.

As is known in the art, to enable recovery an input signal must be sampled at a rate equal to or greater than the Nyquist frequency $F_s$, i.e., at least twice the bandwidth of the input signal. The frequency spectrum of the digitized signal contains the spectrum of the analog input signal along with quantization noise from DC to Fs/2 resulting from the conversion of an analog input signal having an infinite number of states to a digital signal having a fixed number of states. The number of states corresponds to the resolution of the ADC.

In this arrangement, the noise envelope is generally flat. To increase the Signal to Noise Ratio (SNR), the sampling rate can be increased (oversampling), such as by a ratio k, i.e., $kF_S$, to lower the noise floor since the noise is spread over a relatively large frequency range. To further increase the SNR, noise-shaping techniques can be used to push out the noise to higher frequencies. Oversampling can provide a gain of at least 6 dB for each factor of four times oversampling.

SDM ADCs have a variety of coefficients that define the operating characteristics of the circuit. These coefficients can be problematic when attempting to provide programmable ADCs having optimal performance characteristics and flexibility over a range of parameters, such as OSR.

SUMMARY

The present invention provides methods and apparatus for a Sigma-Delta Modulator (SDM) data converter having a selectable Oversampling Ratio (OSR) to include corresponding resonator coefficients. With this arrangement, zero locations can provide notches in the Noise Transfer Function (NTF) for optimal performance. While exemplary SDM configurations having particular orders, NTFs, and coefficients are shown and described herein, it is understood that the invention is applicable to SDMs in general in which it is desirable to enhance the overall performance of the SDM.

In one embodiment, a programmable sigma-delta modulator (SDM) circuit includes a first input to select a first one of a plurality of oversampling ratio (OSR) values, and a clock input to receive a clock signal. A module stores resonator coefficient values, each corresponding to one of the OSR values.

In one particular embodiment, the circuit includes feedback coefficient values that are constant across the OSR values. Circuit configurations include a cascade of integrators with distributed feedback (CIFB) structure and a cascade of resonators with distributed feedback (CRFB) structure.

In other embodiments, the resonator coefficient is selected based upon the OSR and a frequency of the clock signal. In this way, wideband applications can include various bands each having a given clock frequency for which the selected OSR will have a corresponding resonator coefficient value.

In another aspect of the invention, a method includes, for a SDM circuit, receiving an OSR selection and selecting a resonator coefficient based upon the OSR selection. In one embodiment, at least one of another type of coefficient is held constant over multiple ones of the OSR values.

BRIEF DESCRIPTION OF THE DRAWINGS

The exemplary embodiments contained herein will be more fully understood from the following detailed description taken in conjunction with the accompanying drawings, in which.

DETAILED DESCRIPTION

Figure 1:
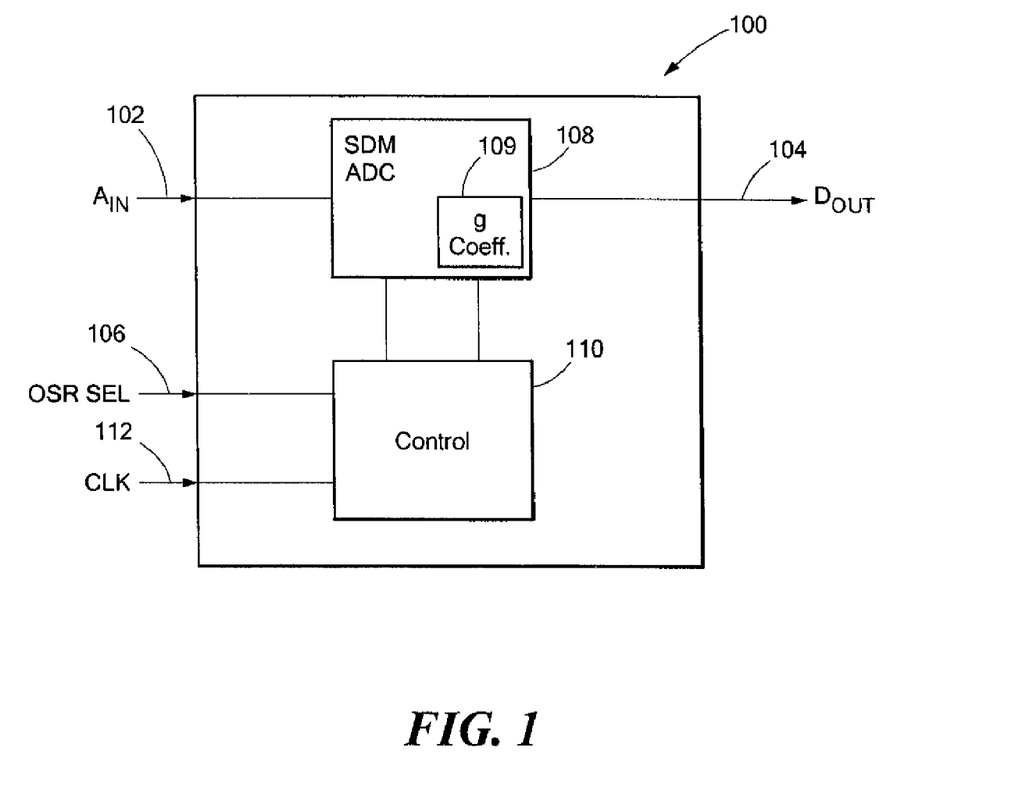
FIG. 1 is a block diagram of an exemplary sigma-delta modulator having a resonator coefficient corresponding to a selected OSR value in accordance with embodiments of the present invention.

FIG. 1 shows an exemplary programmable Sigma-Delta modulator (SDM) type Analog-to-Digital Converter (ADC) 100 in accordance with exemplary embodiments of the present invention. In general, a resonator coefficient g for the SDM corresponds to an oversampling ratio (OSR) selected by a user. With this arrangement, the resonator coefficient creates a notch in a noise filter for the SDM at an optimal location(s) to provide programmable implementations of Analog-to-Digital Converter (ADC) circuits having different OSR requirements.

The SDM ADC 100 receives an analog input signal 102 and outputs a digital output signal 104 in the form of a bit stream. An OSR input 106 determines the OSR selected by the user. Based upon the selected OSR, a corresponding resonator coefficient g is selected from a resonator coefficient module 109 for the noise filter. In one embodiment, the resonator coefficients are stored in the module 109. Alternatively, the resonator coefficients can be calculated in response to user selections, as described more fully below. In one embodiment, an SDM ADC module 108 communicates with a control module 110, as described more fully below. A clock input 112 receives a clock input signal.

It is understood that the OSR select inputs 106 can take a variety of forms including digital, analog, wired, optical, wireless, and the like. The OSR select inputs 106 can be hardwired to a printed circuit board or can be coupled to a circuit, such as a microprocessor providing the OSR selection information. In addition, ADCs can have any number of inputs to enable selection of any suitable number of possible OSRs that can be selected by the user. In an exemplary embodiment, an ASIC (application specific integrated circuit) and/or FPGA (Field Programmable Gate Array) can include a register having a given number of bits that define the selected OSR.

Before describing the invention in further detail, some introductory material is presented. In general, SDMs have a variety of coefficients that determine the performance characteristics of the SDM. Various software tools are known to one of ordinary skill in the art to determine the various coefficients based upon the requirements of a particular application. For example, the Delta-Sigma Toolbox is available from the Mathworks company website at www.mathworks.com.

SDM ADCs includes a series of integrator blocks with various coefficients to provide signal control, noise handling, and stability. A first type of coefficient is a feedback coefficient $a_i$ and a second type of coefficient is a feed-in coefficient $b_i$. A gain coefficient $c_i$ defines the integrator gain for each stage. And a resonator coefficient $g_i$ controls zero locations in the noise transfer function (NTF) of the SDM. For example, in a Butterworth filter a resonator coefficient g can place notches in the filter to widen the noise floor and thereby improve bandwidth.

Figure 2:
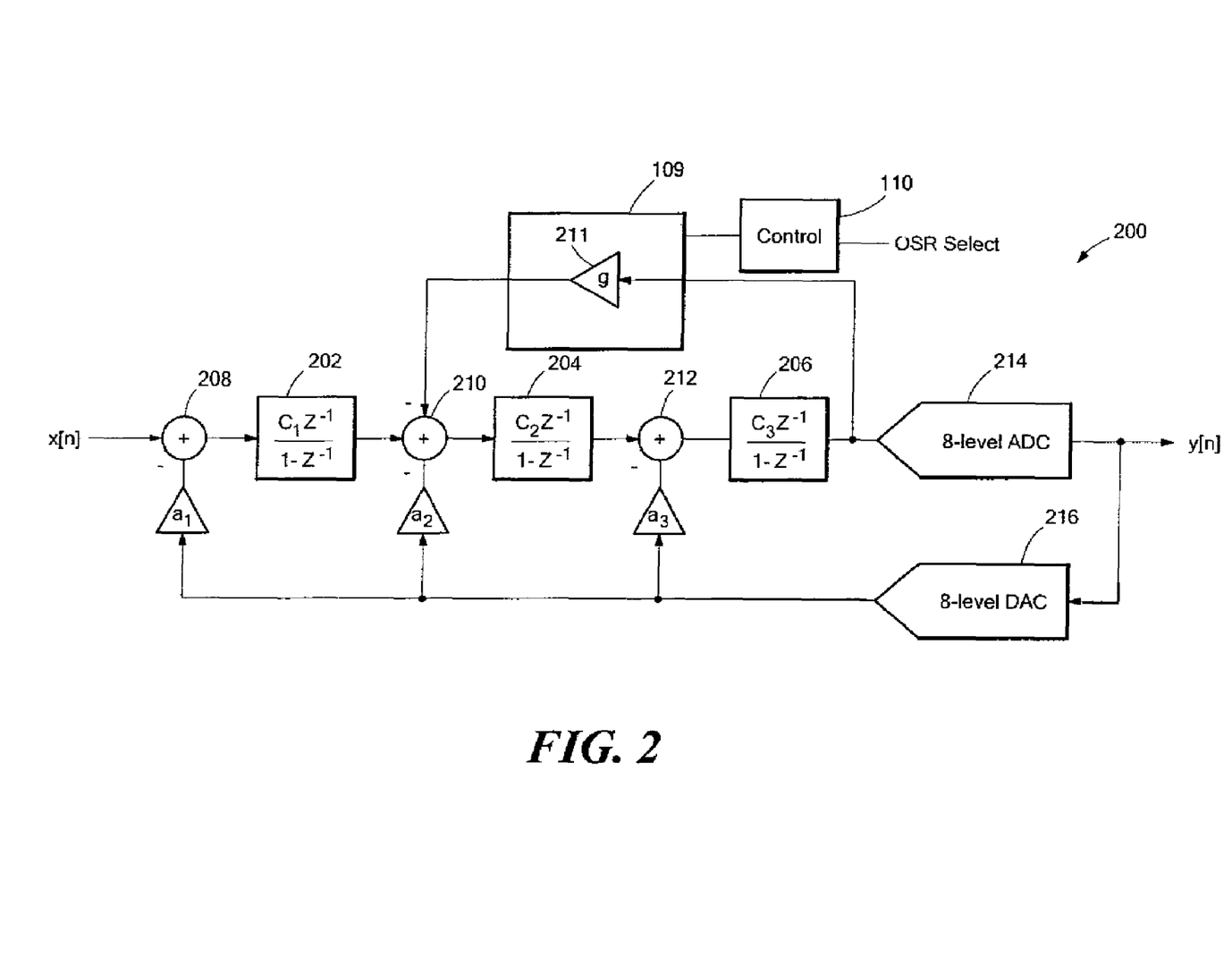
FIG. 2 is a functional diagram of an exemplary SDM ADC having a programmable OSR with corresponding resonator coefficients in accordance with exemplary embodiments of the invention.

FIG. 2 shows an exemplary SDM architecture 200 to provide a programmable OSR with optimized resonator coefficients in accordance with one embodiment of the invention. The illustrative SDM 200 has a third-order single-stage configuration with an inverse-Chebyshev noise transfer function (NTF) employing an 8-level quantization. The illustrated SDM 200 has a so-called cascade of integrators with distributed feedback (CIFB) as each integrator has a delaying integrator structure having a transfer function of $H(z)=z^{-1}/(1-z^{-1})$. First, second and third integrator stages 202, 204, 206 are coupled in series. A first summer 208 receives an input signal x[n] and a first feedback coefficient $a_1$ at a negative input. The summer 208 output is coupled to the first integrator stage 202. A second summer 210 receives the output of the first integrator 202, a second feedback coefficient $a_2$ to be subtracted, and a resonator coefficient g 211. The resonator coefficient is selected from the resonator coefficient storage module 109 based upon the OSR selection provided to the control module 110.

The second summer 210 output is coupled to the second integrator 204 the output of which is coupled to a third summer 212, which also receives a third feedback coefficient a3. Integrator stages 202, 204, 206 can include respective gain coefficients $c_1, c_2, c_3$.

The third summer 212 output is coupled to an 8-level ADC 214. The resonator coefficient g 211 is coupled across the second and third integrator stages 204, 206 as shown. The output of the 8-level ADC provides the digitized signal y[n], which is also fed back via an 8-level DAC 216.

Table 1 below lists exemplary feedback $a_i$ and integrator gain $c_i$ coefficients for the exemplary embodiment illustrated in FIG. 2.

TABLE 1

| SDM coefficients | | | | | |
|---|---|---|---|---|---|
| a1 | a2 | a3 | c1 | c2 | c3 |
| 1 | 0.75 | 1.25 | 0.25 | 1.5 | 1.75 |

As is noted above, the resonator feedback coefficient g defines a notch in the noise transfer function (NTF). The optimal location of the notch can be determined, for example, via a mathematical procedure wherein the amount of the in-band quantization noise is minimized by taking a derivative of an integral and equalizing it to zero. This is repeated for different OSRs as depicted in Table 2, for the illustrated embodiment of FIG. 2.

TABLE 2

| SDM Performance for OSR and resonator coefficient | | |
|---|---|---|
| OSR | g | SNR |
| 128 | 0.5/2048 | 146 dB |
| 96 | 1/2048 | 137 dB |
| 64 | 2/2048 | 125 dB |
| 48 | 4/2048 | 116 dB |
| 32 | 8/2048 | 104 dB |
| 24 | 16/2048 | 95 dB |
| 16 | 32/2048 | 83 dB |
| 12 | 64/2048 | 72 dB |

Techniques for selecting Noise Transfer Function (NTF) zeroes for optimal performance are well known to one of ordinary skill in the art. In general, to optimize zero locations the normalized noise power, which corresponds to the integral of the squared magnitude of the NTF over the signal band, is minimized with respect to the values of all its zeroes. Optimal zero locations are determined by setting partial derivatives of the integral to zero. Selecting optimal notch locations for the NTF is discussed, for example, in Chapter 4 of "Understanding Delta-Sigma Data Converters" by R. Schreier et al. (2005), which is incorporated herein by reference.

The SNR of an SDM is given by the following relation $$SNR = 10\log_{10}\left(\frac{P_i}{P_N}\right) \quad (1)$$

where $P_i$ and $P_N$ are the input signal power and the in-band quantization noise power, respectively. The in-band quantization noise power is given by (assuming a brick-wall digital decimation filter with a cut-off frequency $w_B$ in radians)

$$P_N = 2\int_0^{w_B} |NTF(e^{jw})|^2 \frac{\Delta^2}{12} dw \quad (2)$$

where OSR, $\Delta$, and $NTF(e^{jw})$ are the oversampling ratio, quantizer bin width, and frequency response of the noise transfer function, respectively. Note that in Equation (2), the cut-off frequency of the low-pass filter is equal to the bandwidth of the input signal, and hence $w_B$ can be written in terms of the oversampling ratio as $w_B=\pi/OSR$. The goal here is to find the optimum noise transfer function that maximizes the SNR, and hence minimizes the integral in Equation (2). Similar procedures to achieve this goal have been disclosed in a paper by R. Schreir entitled, "An empirical study of higher-order single-bit delta-sigma modulators" published in *IEEE Transactions on Circuits and Systems II: Analog and Digital Signal Processing*, vol. 40, no. 8, pp. 461-466, August 1993, which is incorporated herein by reference.

For the sigma-delta modulator shown in FIG. 2, the noise transfer function can be written as (assuming $c_i$'s are all equal to one):

$$NTF(z) = \frac{(z-1)(z-z_1)(z-z_2)}{a_1 + a_2(z-1) + a_3(z-1)^2}, \quad (3)$$

where $z=e^{jw}$ is the complex frequency variable, and $z_1$ and $z_2$ are the locations of the zeros introduced by the g coefficient. Since the numerator of NTF(z) must be a polynomial in z with real coefficients, the zeros should be a complex conjugate pair such that $z_1 = e^{jw_z}$ and $z_1 = e^{-jw_z}$, $w_Z$ being the location of the notch in the NTF introduced by the resonator g coefficient. Therefore, the integral in Equation (2) can written as $$P_N = \frac{\Delta^2}{6} \int_0^{w_B} \left| \frac{(e^{jw}-1)(e^{jw}-e^{jw_Z})(e^{jw}-e^{-jw_Z})}{a_1 + a_2(e^{jw}-1) + a_3(e^{jw}-1)^2} \right|^2 dw \quad (4)$$

Note that the frequency variable w in Equation (4) is changing between 0 to $w_B$, and for relatively large OSR (i.e. OSR≧12), $w_B \approx 0$. With this assumption, the amplitude of the denominator of the NTF in Equation (4) can be assumed constant, since its value is not appreciably changing when the frequency variable is swept from 0 to $w_B$. Therefore, $$\left| \frac{1}{a_1 + a_2(e^{jw}-1) + a_3(e^{jw}-1)^2} \right|^2 \approx \frac{1}{a_1^2} \text{ for } 0 \leq w < w_B \quad (5)$$

Using Equation (5), Equation (4) can written as:

$$P_N = \frac{\Delta^2}{a_1^2 6} \int_0^{w_B} |(e^{jw}-1)(e^{jw}-e^{jw_Z})(e^{jw}-e^{-jw_Z})|^2 dw \quad (6)$$

Hence, minimizing Equation (6) reduces to minimizing the following integral equation with respect to $w_Z$:

$$I(w_Z) = \int_0^{w_B} |(e^{jw}-1)(e^{jw}-e^{jw_Z})(e^{jw}-e^{-jw_Z})|^2 dw \quad (7)$$

Using Taylor Series expansion, one notes that $e^x \approx 1+x$ for $x \approx 0$. Employing this approximation for the complex exponentials, Equation (7) can be simplified as:

$$I(w_Z) = \int_0^{w_B} w^2(w^2 - w_Z^2) dw \quad (8)$$

In general, for an $N^{th}$-order sigma-delta modulator, we have (for N is odd):

$$I(w_{Z1}, w_{Z2}, \ldots) = \int_0^{w_B} \left\{ w^2 \prod_{i=1}^{\frac{N-1}{2}} (w^2 - w_{Zi}^2) \right\} dw \quad (9)$$

and for an N is even:

$$I(w_{Z1}, w_{Z2}, \ldots) = \int_0^{w_B} \left\{ \prod_{i=1}^{\frac{N}{2}} (w^2 - w_{Zi}^2) \right\} dw \quad (10)$$

Reverting attention again to the third-order example given here, the integral in Equation (8) is minimized with respect to $w_Z$. Evaluating (8) provides:

$$I(w_Z) = \frac{w_B^7}{7} + w_Z^4 \frac{w_B^3}{3} - 2w_Z^2 \frac{w_B^5}{5} \quad (11)$$

Taking the partial derivate of Equation (11) with respect to $w_Z$ yields the location of the zero of the NTF that minimizes the in-band noise power:

$$\frac{\partial I(w_Z)}{\partial w_Z} = 0 \Rightarrow w_Z = \pm \sqrt{\frac{3}{5}} w_B \quad (12)$$

The g coefficient can be then calculated using Equation (12) as follows (note that $w_B = \pi/OSR$):

$$\frac{\sqrt{g}}{c_2} = \pm \sqrt{\frac{3}{5}} \frac{\pi}{OSR} \Rightarrow g = \frac{3\pi^2}{5c_2 OSR^2} \quad (13)$$

Note that in Equation (13), $c_2$ represents the integrator gain for the second stage, and is included here to compensate for assuming all $c_i$'s equal to one at the beginning. The values presented in Table 2 are obtained from Equation (13).

It should also be noted that the above formula for the g coefficient is valid when OSR≧12. For smaller OSRs, the assumptions made in these calculations may not be applicable. However, Sigma-delta modulators are typically with oversampling larger than 12, therefore OSR≧12 assumption does not impose strict limitations on the use of the formula. Furthermore, if OSR is lower than this value, then numerical optimization methods (instead of mathematical optimization) can be used to calculate the optimal values for the g coefficients.

Referring again to Table 2 above, it can be seen that each doubling in the OSR requires scaling down the resonator coefficient g by about one fourth. Furthermore, it has been determined according to mathematical analysis and simulation, other coefficients of the SDM have relatively little influence on the SNR (Signal to Noise Ratio) and DR (Dynamic Range) performance. In an exemplary embodiment, this behavior is used to simplify implementation of programmable SDM ADCs by enabling a user to select an OSR, to which a predetermined resonator coefficient g corresponds.

In an embodiment, the feedback coefficients $a_1$, $a_2$, $a_3$, and the gain coefficients $c_1$, $c_2$, and $c_3$ for the embodiment of FIG. 2 are held fixed during operation at each OSR level. As noted above, for a given order SDM having a predetermined number of bits in the quantizer these coefficients are loosely dependent on the OSR. Thus, programmability is achieved by adapting only the resonator coefficients for each OSR. This simplifies the programmability of the SDM, while producing near optimal SNR and dynamic range results.

It is understood that the OSR/resonator coefficient relationship described above is applicable to a variety of SDM configurations. For example, a SDM ADC can have any practical order and can utilize NTFs of varying types known to one of ordinary skill in the art.

Figure 3:
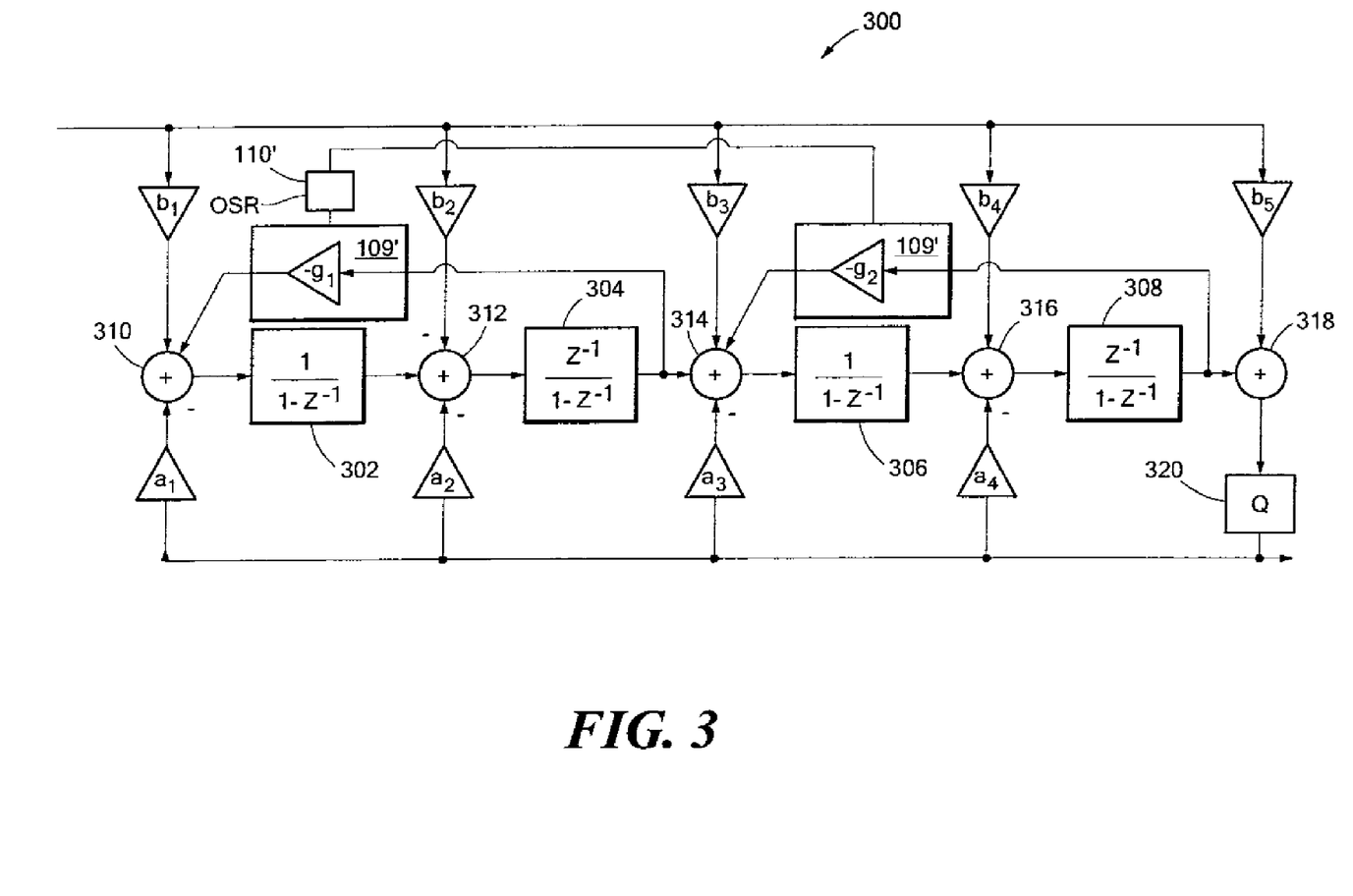
FIG. 3 is a functional diagram of a further SDM ADC having a programmable OSR with corresponding resonator coefficients in accordance with exemplary embodiments of the invention.

FIG. 3 shows a further SDM 300 including a cascade of resonators with distributed feedback (CRFB) topology with programmable OSR and optimal resonator coefficient selection. The SDM has first, second, third, and fourth integrator stages 302, 304, 306, 308 cascaded as shown. The first and third integrators 302, 304 are delay free to maintain poles on the unit circle. Each of the feedback coefficients $a_1$, $a_2$, $a_3$ $a_4$, are coupled to the negative input of respective first, second, third, and fourth summers 310, 312, 314, 316. A fifth summer 318 receives an output from the fourth integrator 308. A feed-in coefficient $b_1$, $b_2$, $b_3$, $b_4$, $b_5$ is provided to each of the respective summers 310, 312, 314, 316, 318, as shown. An output of the fifth summer 318 is provided to the quantizer 320.

A first resonator coefficient $g_1$ is coupled across the first and second integrators 302, 304, and a second resonator coefficient $g_2$ is coupled across the third and fourth integrators 306, 308. In one embodiment, the first and second resonator coefficients $g_1$, $g_2$, are independently tied to a given OSR value. In an alternative embodiment, the first and second resonator coefficients are selected as a pair for each OSR.

The first and second resonator coefficients $g_1$, $g_2$ are selected from a resonator coefficient storage module 109', which is coupled to a control module 110' that receives the OSR selection information. Based upon the selected OSR, the resonator coefficients $g_1$, $g_2$ are selected.

In another embodiment directed to so-called wideband implementations, the resonator coefficient g is selected based upon OSR and clock rate. The total bandwidth can be divided into bands each of which is associated with a given clock rate. For example, again looking to Table 2 it can be seen that the OSR covers about a 10-1 ratio (128 to 12) for OSR. To cover a 1000-1 ratio, each decade can have a clock rate differing by a factor of ten. Cutting the clock frequency by a factor ten has the same effect as changing the OSR by a factor of ten. Within each band, and for the given clock rate, for each OSR the resonator coefficient can be selected in a manner like that shown in Table 2.

In one embodiment, coefficients, e.g., $a_i$, $b_i$, $c_i$, other than the resonator coefficients $g_i$ are constant across OSR. In alternative embodiments, one or more of $a_i$, $b_i$, $c_i$, are selected based upon the OSR and/or resonator coefficient.

It is understood that the number and placement of resonator coefficients can vary to meet the needs of a particular application without departing from the present invention. In general, other embodiments of the invention are contemplated having various resonator coefficients selected based upon the OSR.

Figure 4:
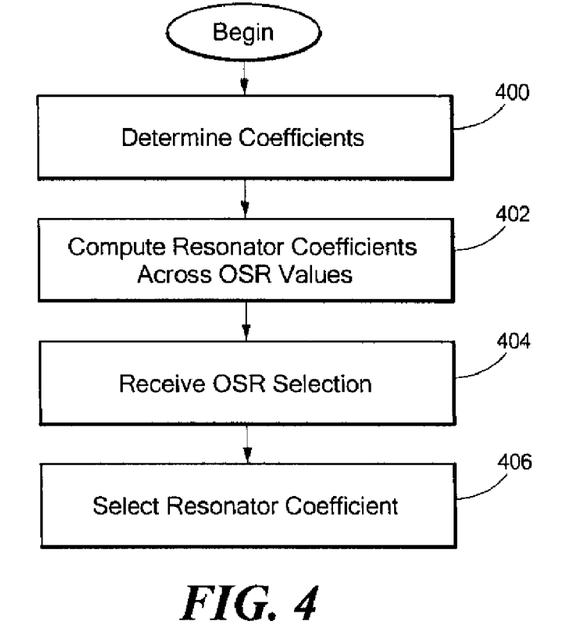
FIG. 4 is a flow diagram of an exemplary sequence of steps to implement resonator coefficient selection corresponding to OSR selection in accordance to embodiments of the invention.

FIG. 4 shows an exemplary sequence of steps to implement resonator coefficient selection corresponding to OSR values. In step 400, coefficients are determined for an SDM ADC having particular characteristics. Resonator coefficients are computed for each supported OSR value in step 402. In step 404, an OSR value is selected by the user, such as by writing to a configuration register In one embodiment, the OSR value is provided to a control module coupled to an SDM implementation module. Based upon the OSR value, a resonator coefficient value is selected in step 406. In one embodiment, a resonator coefficient value is selected from a plurality of values stored in a resonator coefficient storage module. In an exemplary embodiment, other coefficient values are constant across OSR. Alternatively, one or more of feedback, feed-in, and gain coefficient values are selected based upon the OSR and/or resonator coefficient, and/or clock frequency.

It is understood that the oversampled output of the SDM can be decimated to reduce the output sample rate, while increasing the data bit width. It is further possible to create multi-rate decimation filters with either multiple output sample rates or programmable decimation filters with integer or even fraction decimation rates. One such filter which can be programmable, is a so-called Cascade of Integrator (CIC), sometimes referred to as a sinc or comb filter. Other embodiments are contemplated having a programmable decimation filter to provide a fine adjustment on the output sample rate while maintaining a constant OSR and Fs to the SDM.

The embodiments of the invention described herein, provide programmable SDM ADC architectures that can be readily implemented to efficiently support different OSR requirements with optimal resonator coefficients. By adapting the resonator coefficient selection to the OSR, the overall performance of an SDM ADC is enhanced over a range of OSRs.

Figure 5:
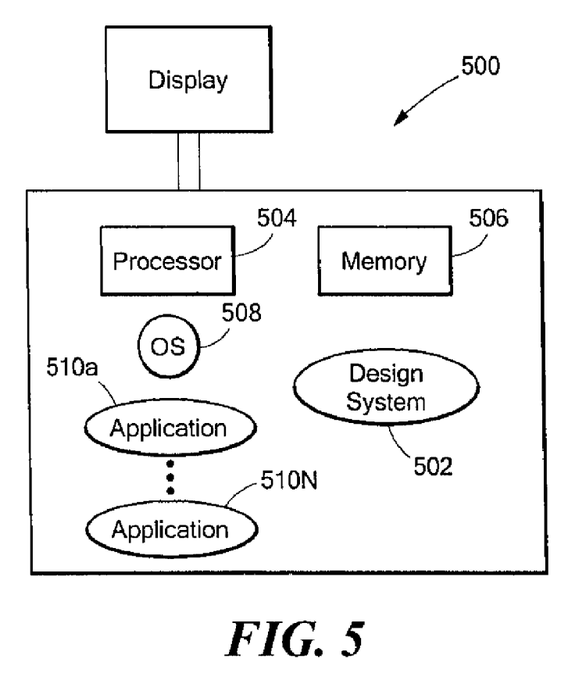
FIG. 5 is a block diagram of a system that can be used to implement resonator coefficient selection corresponding to OSR selection in accordance to embodiments of the invention.

As shown in FIG. 5, in an exemplary embodiment, an SDM ADC such as those described above can be developed using an application design system, such as the Intrinsix Sigma-Delta Modulator Refinery (or SDM Refinery). FIG. 5 shows an exemplary workstation 500 having a design system 502 running in conjunction with a processor 504, memory 506, and operating system 508. Various applications 510a-N can also run on the workstation under the operating system 508 in a manner well known in the art.

The design system 502 provides a design automation suite to allow fast, optimized design of Sigma-Delta Modulators (SDMs) used in over-sampled Digital-to-Analog and Analog-to-Digital converters (DACs and ADCs, respectively) and Fractional-N synthesizers. An oversampled converter trades off amplitude accuracy with time accuracy by pushing the frequency of the quantization noise outside the band of interest.

In general, a user specifies Over-Sampling Ratio (OSR) values, quantization levels, order of complexity and center frequency. The system 502 first estimates the zero and pole locations, then optimizes the locations, estimates the Signal-to-Noise Ratio (SNR) as well as the Effective Number of Bits (ENOB) and then computes binary weighted modulator coefficients to achieve a stable, implemental modulator. As described above, resonator coefficients can be computed for each selectable OSR value. An SDM DAC can often be implemented efficiently in a digital ASIC using only logic gates or with minimal off chip passive filters.

It understood that exemplary embodiments of the invention shown and described herein can be implemented in a variety of configurations utilizing hardware and/or software. One or more embodiments of the invention may also be realized wholly or partially in software, in a computer-readable medium, and/or in a transmission medium. For example, software embodying the present invention, in one embodiment, resides in an application running on a general-purpose computer system. In at least one embodiment, the present invention is embodied in a computer-readable program medium usable with a general purpose computer system. In addition, in one embodiment, the invention is embodied in a transmission medium, such as one or more carrier wave signals transmitted between the general purpose computer system and another entity, such as another computer system, a server, a wireless network, etc. In another embodiment, an application design tool is used to generate a circuit. It is understood that a circuit can includes a physical implementation, as well as a computer-generated circuit implementation, which can be used to build a physical implementation.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A programmable sigma-delta modulator (SDM) circuit, comprising:

a first input to select a first one of a plurality of oversampling ratio (OSR) values;

a clock input to receive a clock signal; and a module to provide a plurality of resonator coefficient values, each of the plurality of resonator coefficient values corresponding to one of the OSR values, wherein the SDM circuit includes a third-order single-stage configuration with an inverse-Chebyshev noise transfer function.

* * * * *

UNITED STATES PATENT AND TRADEMARK OFFICE
CERTIFICATE OF CORRECTION

PATENT NO. : 7,439,891 B2
APPLICATION NO. : 11/745094
DATED : October 21, 2008
INVENTOR(S) : Mucahit Kozak et al.

It is certified that error appears in the above-identified patent and that said Letters Patent is hereby corrected as shown below:

Column 1, line 23, delete "sigma delta" and replace with --sigma-delta--.

Column 1, line 24, delete "sigma delta" and replace with --sigma-delta--.

Column 3, line 48, delete "integrator 204 the output" and replace with --integrator 204, the output--.

Column 3, line 49, delete "a3." and replace with --$a_3$.--.

Column 4, line 12, delete "coefficient" and replace with --coefficients--.

Column 5, line 14, delete " $z=e_1=e^{jw_i}$ " and replace with -- $z_1 = e^{jw_i}$ --.

Column 5, line 16, delete "can written" and replace with --can be written--.

Column 5, line 35, delete "can written" and replace with --can be written--.

Column 6, line 1, delete "for an N" and replace with --for N--.

Column 7, line 13, delete "302, 304" and replace with --302, 306--.

Column 7, line 60, delete "register In one" and replace with --register. In one--.

UNITED STATES PATENT AND TRADEMARK OFFICE
CERTIFICATE OF CORRECTION

PATENT NO.       : 7,439,891 B2
APPLICATION NO.  : 11/745094
DATED            : October 21, 2008
INVENTOR(S)      : Mucahit Kozak et al.

It is certified that error appears in the above-identified patent and that said Letters Patent is hereby corrected as shown below:

Column 8, line 47, delete "It understood" and replace with --It is understood--.

Column 8, line 63, delete "includes" and replace with --include--.

Signed and Sealed this

Sixteenth Day of December, 2008

JON W. DUDAS
*Director of the United States Patent and Trademark Office*